Sept. 9, 1952 R. R. ENGLISH 2,610,299

ELECTRICAL APPARATUS

Filed Aug. 12, 1950 3 Sheets-Sheet 1

INVENTOR.
Robert R. English
BY Robert L. Kahn
Atty.

Sept. 9, 1952 R. R. ENGLISH 2,610,299

ELECTRICAL APPARATUS

Filed Aug. 12, 1950 3 Sheets-Sheet 2

INVENTOR.
Robert R. English
BY
Robert L. Kahn
Atty

Sept. 9, 1952　　R. R. ENGLISH　　2,610,299

ELECTRICAL APPARATUS

Filed Aug. 12, 1950　　3 Sheets-Sheet 3

INVENTOR.
Robert R. English
BY
Robert L Kahn
Atty.

Patented Sept. 9, 1952

2,610,299

UNITED STATES PATENT OFFICE 2,610,299

ELECTRICAL APPARATUS

Robert R. English, Chicago, Ill., assignor to Oak Mfg. Co., Chicago, Ill., a corporation of Illinois Application August 12, 1950, Serial No. 179,059

6 Claims. (Cl. 250—40)

This invention relates to an electrical apparatus and more particularly to a high frequency variable inductance tuning system. The invention is useful for vane type of inductance tuners useful for frequencies of from about 50 megacycles up to 300 megacycles and even higher, particularly in the so-called UHF band for television ranging from 500 megacycles up to about 900 megacycles.

Vane type tuners for high frequency work are well known and consist of one or more stator elements forming inductance loops cooperating with rotor plates similar to condenser plates. The position of the rotor plates with respect to inductance loops determines the effective inductance of the loops and thus makes it possible to vary the inductance and thus vary the resonant frequency of one or more circuits.

Most systems operating in the ranges specified above, such systems generally being used in television receivers and frequency modulation receivers, utilize a super-heterodyne circuit. As is well known, such a circuit utilizes a local oscillator to beat a signal frequency and produce, as one resultant, a lower modulated frequency which may be efficiently handled in more or less conventional amplifiers. Tuning in such systems is accomplished by varying the oscillator frequency and usually simultaneously varying a tuned circuit at signal frequency. Frequently, the mixer circuit is also tuned so that a mixer or first detector tube may combine the output of the local oscillator and the signal frequency to be handled.

This invention relates to those systems wherein the mixer tube has one control electrode upon which is impressed desired signal frequencies and the output of the local oscillator. As a rule, the output of the local oscillator is impressed upon the control electrode of the mixer tube by means of a coupling condenser. Such coupling condenser may either be a discrete condenser or may be stray capacitance with or without a discrete condenser.

Where the tuning range is substantial, such as for example between about 50 megacycles and about 350 megacycles, a fixed capacitance coupling between the local oscillator and mixer tube results in a substantial variation in impressed oscillator potential at the electrode of the mixer tube. This is due to the fact that the impedance of the tuning circuit varies with frequency over a substantial range so that the potential normally available across the tuner drops off with increase in frequency. Thus at the high frequency end of the tuning range, the impressed potential on the oscillator grid may be quite unfavorable for operation. The impressed oscillator potential for the low frequency end of the tuning range may be satisfactory. Variation in oscillator potential, beyond a desirable range, represents a serious drawback for satisfactory operation.

In accordance with this invention, a vane type tuner for high frequency tuning is constructed so that when connected into a circuit, substantially uniform oscillator potential will be available at the mixer tube electrodes. A construction embodying the present invention incorporates therein a variable coupling capacitance which effectively controls the coupling capacitance between the oscillator output and the mixer tube input so that a uniform and substantially constant oscillator level at the mixer input is maintained over substantially the entire tuning range.

In order that the invention may be fully understood, it will be explained in connection with the accompanying drawings where Figure 1 is a top plan view of a tuner element embodying the present invention.

Figure 1:
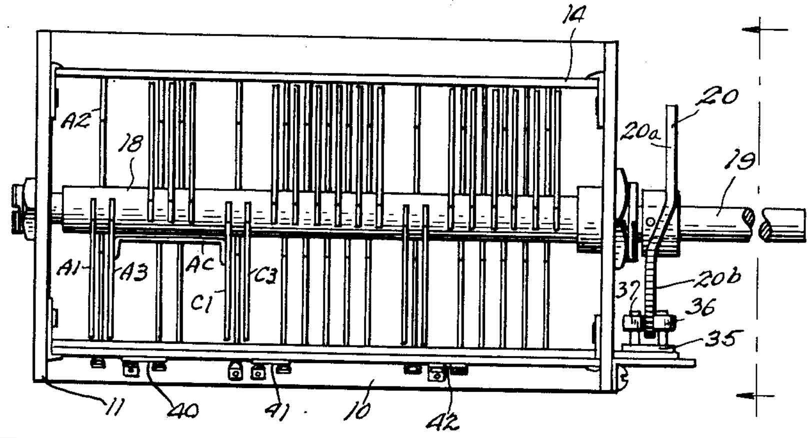

Referring first to the structure shown in Figures 1 to 5 inclusive, the tuner proper bears a superficial resemblance to a variable condenser used in conventional radio receivers. Thus pressed steel frame 10 having front part 11 and rear part 12, all preferably in one piece, is provided. Between front and rear walls 11 and 12 of the frame there extends on each side insulating strips 14 and 15. Rotatively secured in front part 11 and rear part 12 of the frame is insulating shaft 18 having control portion 19 outside of the frame. Shaft 18 which is of suitable insulating material like Bakelite is secured for rotation in any one of a number of well-known ways. Part 19 of the shaft may be of metal or insulating material and carries cam plate 20 to be described later.

Insulating portion 18 of the shaft carries a number of rotor plates all of similar construction. As shown in detail in Figure 4, each rotor plate consists of a generally semicircular piece of metal 22 having mounting portion 23 at the center suitably shaped so that each rotor plate may be secured in a slot in shaft 18. Each rotor plate may be made of any suitable material having good electrical conductivity such as aluminum, copper, brass or the like. The shape of the individual rotor plates may be varied from that shown.

Figure 4:
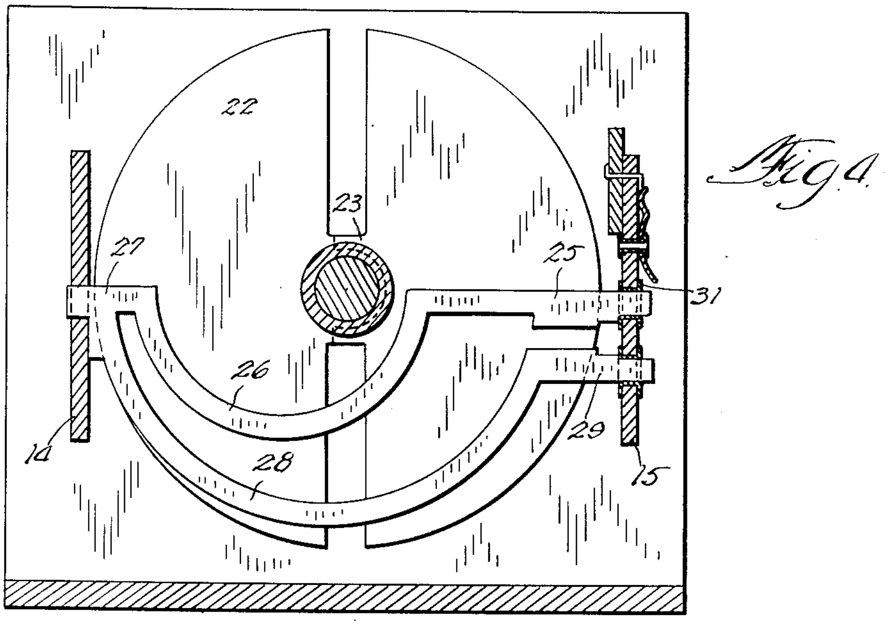
Figure 4 is a section on line 4—4 of Figure 2.

Cooperating with the rotor plates are stator tuning loops, one of which is shown in detail in Figure 4 and will now be described. Each stator loop includes top terminal portion 25, joined to curved portion 26, extending to intermediate terminal portion 27. From intermediate portion 27, lower curved portion 28 extends to lower terminal portion 29. The entire loop is preferably formed of one piece of metal, such as copper, suitably stamped out and having sufficient body to maintain its shape. Terminal portions 25, 27 and 29 may be shaped as shown so that the ends may be suitably disposed in slots in insulating strips 14 and 15. Most of the metallic connections involving the stator loops are made at terminal members 25 and 29.

Figure 5:
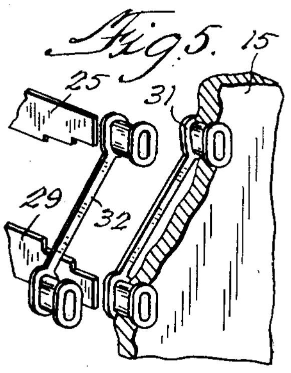
Figure 5 is a perspective detail with certain parts broken away showing how the tuning loops are connected in the tuning element of Figure 1.

A detailed showing of the mounting of terminal portions 25 and 29 in insulating support 15 is shown in Figure 5. Thus insulating support 15 has suitable slots having eyelets 31 of desired shape for accommodating the ends of the stator loops. In order to provide a metallic connection between the terminal of one loop and the terminal of an adjacent loop, connecting lugs 32 having end portions suitably shaped to be threaded over the ends of the inductance loops are provided. Lugs 32 are disposed on the inside of insulating support 15. The metal of terminal portions 25 and 29 of a stator loop are sufficiently long to project through the eyelets and beyond insulating plate 15 so that wire may be soldered thereto.

The connection of such loops in a circuit will be described later. Similarly, intermediate terminal portion 27 may also have a part extending beyond the insulating support to which solder may be applied. The solder on the ends of the metal outside of insulating supports 14 and 15 may function to maintain the loops mechanically in place in the insulating material and also provide a convenient place for connection of wires.

The tuning unit shown in Figures 1 to 5 inclusive may conveniently cover two wave bands, the two wave bands forming an extended frequency band for tuning. As more fully described and claimed in the copending application of Robert J. Galitz, Serial No. 132,830 filed December 14, 1949, now Patent 2,558,482 issued June 26, 1951, the stator loops for the two wave bands may be arranged in a conventional manner, with the loops being disposed side by side within the supporting frame. However, the rotor elements for one wave band are rotatively displaced 180° with respect to the rotor elements for the other wave band. Thus, the two wave bands may be handled in a structure which is compact and requires little space. To this end, therefore, the tuner illustrated in Figures 1 and 2 may be considered as divided into six sections indicated by letters A to F inclusive, beginning with the section at rear part 12 of the frame. The number and arrangement of the sections may be varied to suit different circuit requirements.

Figure 2:
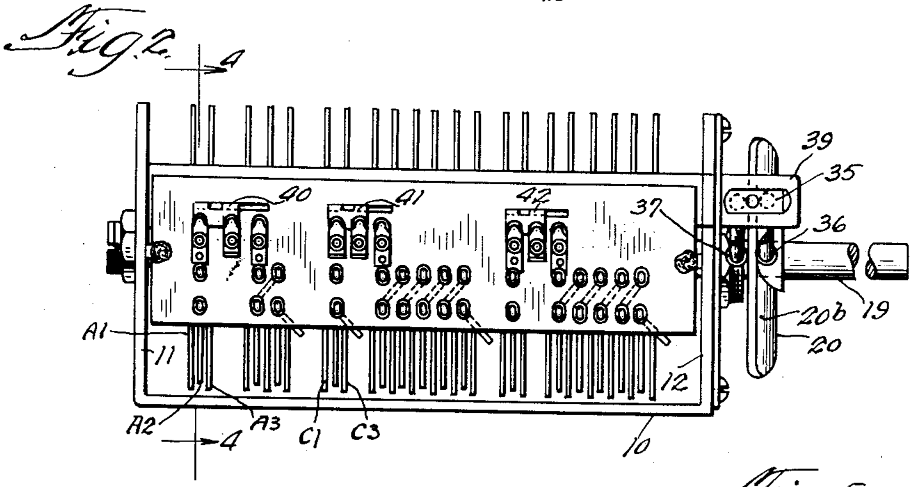
Figure 2 is a side elevation of the structure shown in Figure 1.
Figure 3:
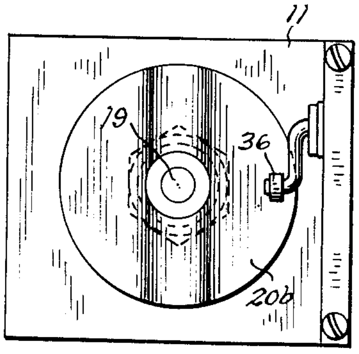
Figure 3 is an end section taken on line 3—3 of Figure 1 and showing the front of the tuner with the cam arrangement for switching.
Figure 7:
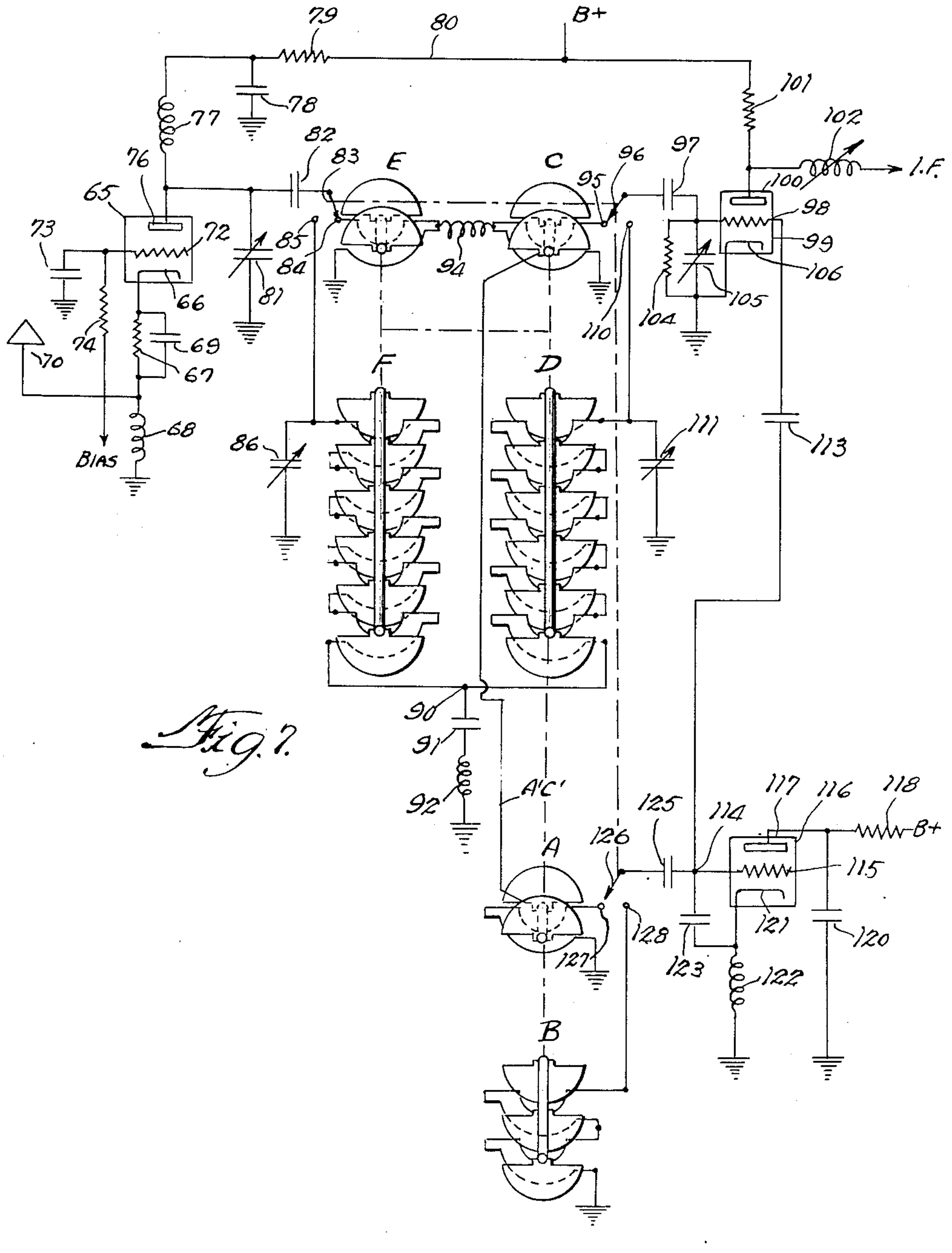
Figure 7 is a circuit diagram of a simple system embodying the present invention.

The number of sections shown in the structure illustrated in Figures 1 and 2 is merely exemplary of a tuner used in the circuit to be described in Figure 7. Thus as shown, sections A, C and E cooperate together for tuning over a high part of the band while sections B, D and F cooperate for tuning over a low part of the range. Therefore, the rotors for sections A, C and F will be aligned while the remaining rotors will be 180° out. By virtue of this arrangement, a tuning range of about 360° is provided, approximately half of this tuning range covering the low band and the remaining half covering the high band.

In order to render operative the desired portion of the tuner for a particular band, cam 20 is provided, this being rigidly secured on the shaft. Cam 20 has parts 20*a* and 20*b* off-set from each other as shown in Figure 1. The off-set portions of the cam are connected together by small intermediate portions, one of which is shown as 20*c*. Cooperating with cam 20 is follower 35 having rollers 36 and 37 on opposite sides of the cam. Cam follower 35 is attached to insulating strip 39 mounted on insulating strip 15 for longitudinal motion. Insulating strip 39 carries movable contacts 40 to 42 inclusive, these contacts sliding in slots in strip 15. The movable contacts are adapted to cooperate with fixed contacts as shown for switching in or out active inductance loops. The circuit details in connection with the switching will be described when Figure 7 is considered.

The arrangement of cam 20 and the off-sets is such that the switch is in one position as shown in Figure 2 or in another position left of that shown in Figure 2 for most of the travel of the rotor when one or the other group of the rotor plates is in cooperating position with the inductance loops. The cam is so oriented that switching occurs when one group of rotor plates or the other group of rotor plates is just beginning to go out of active engagement with the stator loops.

Other means for accomplishing the switching at desired times may be utilized. As shown in Figures 1 and 2, section A has one stator and two rotor plates on opposite sides. The same is true of sections C and E. Section B has two stator loops and three rotor plates. Sections D and F each have five stator plates and six rotor plates. The individual plates and loops are indicated by a section letter as A with a number. The number of stator loops may be varied and the number of rotor plates may also be varied depending upon circuit requirements. Thus in some instances, it may be necessary or desirable to omit a rotor plate outside of a stator loop or between a pair of stator loops. All this will be dependent upon the desired tuning action, the shape and disposition of stator loops and rotor plates, all well known in the art. The number and disposition of stator and rotor elements as shown in Figures 1 and 2 is merely illustrative and is shown by way of an example of a device which may be used in the circuit to be described in connection with Figure 7.

In certain instances shielding may be required between sections in the tuner shown in Figures 1 and 2. Furthermore, certain sections must be remote from other sections to reduce coupling.

Thus, section A may be in the high frequency part of the oscillator while section B may be in the low frequency part of the oscillator. Section C may be used in the high frequency band of the mixer while section D has the same function for the low frequency part of the band. Sections E and F are respectively for the high and low bands of the plate coils of the amplifier.

It has been determined that with a metal base of the type shown for the tuner, the oscillator section of the tuning unit operates better at the rear end of this frame. In particular, the high band part of the oscillator section is preferably disposed at the extreme end, remote from the manual control end having movable metal parts. This improves oscillator stability by confining oscillator currents to a minimum surface. The various metal parts forming the cam, roller, switch contacts, and the like, all have a definite capacitance to ground and the fact that these parts are movable tends to impair the oscillator stability.

In accordance with this invention, rotor plate A3 and rotor plate C1 are metallically connected together by wire AC. This wire may be disposed along the outside of insulating shaft 18 and be soldered to the two rotor plates. Wire AC is disposed on a portion of the shaft free of rotor plates for section B. In a tuner of this type, it is desirable to prevent coupling except as provided by wire AC between sections A and C of the tuner. Thus, these two sections are spaced from each other with section B disposed between them.

Figure 6:
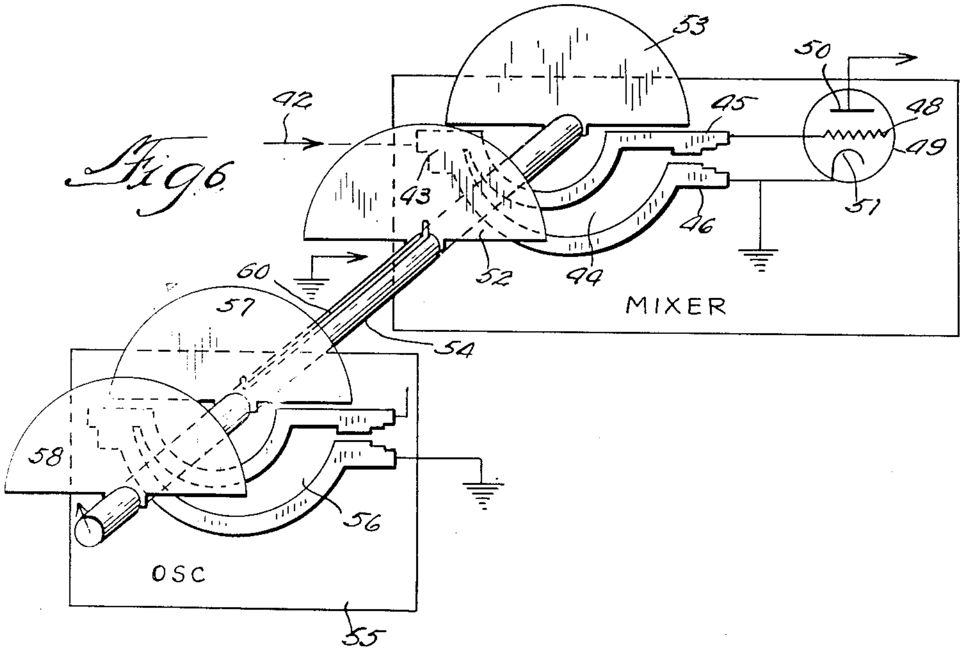
Figure 6 is a diagrammatic view of a simple form of a system embodying the present invention.

Referring now to Figure 6, a generalized circuit for utilizing the tuner illustrated here is shown. Any suitable source of radio frequency signals may be used. While the invention as a whole may be applied either to transmitters or receivers, its greatest field of utility is in connection with receivers, particularly for television and frequency modulation bands and, accordingly, the description will be given in connection with a receiver.

Thus wire 62 together with ground may be provided with suitable signals upon which the tuner is to operate. It is understood that these signals may be mixed and constitute all signals received by an antenna system. Wire 62 supplies signals to intermediate terminal portion 27 of inductance loop 44 having terminal portions 45 and 46. The mechanical construction and arrangement of the inductance loop and cooperating rotor plate will be as above described in connection with Figures 1 to 5 inclusive.

Terminal 45 of the inductance loop is connected to control grid 48 of mixer tube 49. Tube 49 has anode 50 and cathode 51 connected to ground and terminal 46 of the inductance loop. The connections for the vacuum tube are diagrammatic and in practice there may be condensers, chokes and resistors for blocking and biasing purposes.

Cooperating with inductance loop 44 are rotor plates 52 and 53 disposed on opposite sides of the inductance loop. It is understood that plate 53 may be omitted under certain conditions and that in all cases, the rotor plates are of good conducting material mounted upon insulating shaft 54. Forming part of oscillator 55 is at least one inductance loop 56 suitably connected in a circuit so that oscillations are present in the loop. Cooperating with inductance loop 56 is rotor plate 57 on one side of inductance loop 56 and rotor plate 58 on the other side thereof. Again it is to be understood that the number of inductance loops and the number and disposition of the rotor plates in the oscillator may be varied to suit requirements.

In order to feed the output of oscillator 55 to loop 44, wire 60 lying along shaft 54 is provided, this wire connecting rotor plates 57 and 52. By proper design, the potential of the oscillator as applied to inductance loop 44 will be substantially constant over the tunable range of the system.

Referring now to Figure 7, a system for utilizing a tuner embodying the present invention is shown. Radio frequency amplifier 65 has cathode 66 connected through bias resistor 67 and radio frequency choke to ground. Resistor 67 is by-passed by condenser 69 supplied by signals from antenna system generally indicated by numeral 70.

Amplifier 65 has control grid 72 grounded for radio frequency by condenser 73 and connected through resistor 74 to suitable automatic gain control means. Inasmuch as such means are old in the art, a detailed showing is not believed to be necessary. Amplifier 65 has anode 76 connected through radio frequency choke 77 to grounded condenser 78. Choke 77 is also connected through isolating resistor 79 to conductor 80 connected to a suitable source of positive potential.

Anode 76 is connected to the high side of grounded variable condenser 81. Anode 76 is also connected through coupling condenser 82 to movable switch contact 83. Movable switch contact 83 is adapted to cooperate with fixed contacts 84 and 85 respectively. Fixed contact 84 is connected to the top terminal of the inductance loop for section E, the lower terminal of this loop being grounded. Switch contact 85 is connected to the high side of variable condenser 86, the other side of this condenser being grounded. Switch contact 85 is also connected to the top terminal of an inductance loop including section F.

As is clearly evident in the drawing, the inductance loops of this tuning section are connected together in series, the bottom terminal of the last loop being connected to junction 90 which in turn is connected through condenser 91 and choke 92 to ground. The inductance loops for tuning sections E and F are provided with cooperating rotor plates as shown. Tuning section E is for the high band while tuning section F is for the low band so that the rotor plates for section E are rotatively displaced 180° from the rotor plates for section F.

The intermediate terminal for inductance loop of the tuning section E is connected through choke 94 to the intermediate terminal of an inductance loop for tuning section C. This inductance loop has the lower terminal grounded while the upper terminal is connected to fixed switch contact 95. Switch contact 95 is one of two fixed contacts cooperating with movable contact 96 connected through coupling condenser 97 to control grid 98 of mixer tube 99. Mixer tube 99 has anode 100 connected through blocking resistor 101 to wire 80 and to a positive pole of a source of potential. Anode 100 is also connected to suitable inductance 102 to a suitable intermediate frequency amplifier not shown.

Control grid 98 is connected to ground through resistor 104 shunted by variable condenser 105. Mixer 99 has cathode 106 connected to ground in the usual manner. Cooperating with movable switch contact 96 is fixed contact 110 going to tuning section D. Switch contact 110 is connected to ground through condenser 111 and is also connected to one terminal of an inductance loop in tuning section D. The various inductance loops in tuning section D are also connected in series as in F, the end terminal being connected to junction 90. Sections C and D are respectively the high and low band mixer sections.

Control grid 98 of mixer tube 99 is also connected through blocking condenser 113 to junction point 114. Junction 114 is connected to control electrode 115 of oscillator tube 116. Tube 116 has anode 117 connected through isolating resistor 118 to a suitable source of potential, the anode being grounded for radio frequency by condenser 120. Oscillator tube 116 has cathode 121 connected to ground through choke 122. Cathode 121 is also connected to junction 114 by condenser 123. Junction 114 is connected through blocking condenser 125 to movable contact 126 of a switch. This movable contact cooperates with fixed contacts 127 and 128 respectively. Contact 127 is connected to the top terminal of an inductance loop in section A, the lower terminal of this loop being grounded. Similarly, contact 128 is connected to the top terminal of a pair of series connected inductance loops, the end one being grounded. This forms the tuning section B. The inductance loops for sections A and B are provided with rotor plates as shown. Section A is for the high band while section B is for the low band of the oscillator and accordingly the rotor plates for section A are angularly aligned with the rotor plates for sections C and E. Similarly, the rotor plates for section B are angularly aligned with the rotor plates for sections D and F.

In order to maintain a substantially constant potential applied from the oscillator to the mixer over the high frequency part of the band, adjacent rotor plates in sections A and C are connected by wire A'C'. The mechanical arrangement of the tuning sections and connecting wire may be as illustrated in Figures 1 and 2, although some variations are possible. It is not necessary that the tuner as a whole have high and low frequency bands. Thus for one band, sections B, D and F would be eliminated. Tuning sections A, C and E would remain, the wire connection provided A'C' remaining as shown. However, a broad band for television may be conveniently provided by the arrangement as shown in Figure 7.

The switching, accomplished by movable contacts 83, 96 and 126, is provided by the movable contacts on the construction shown in Figures 1 and 2. The stationary contacts shown in the circuit diagram in Figure 7 are disposed on insulating strip 15 in the tuner of Figures 1 and 2. It is understood, that in making the connections, due precautions should be observed for controlling the length of lead.

What is claimed is:

1. A tuner of the inductance type for high frequency circuits, said tuner comprising a frame, a shaft rotatively secured in said frame, stator elements supported in said frame, each stator element comprising a flat loop of metal, rotor elements insulatingly carried by said shaft, each rotor element comprising a conducting plate adapted to move in its own plane for coupling with at least one inductance loop, the planes of the stator and rotor elements being parallel, said tuner having at least two tuning sections, one tuning section being for use in an oscillator and the other tuning section being for use in a mixer circuit, and a metallic connection between one rotor element of the oscillator section and a rotor element of the mixer section.

2. A tuner for controlling the high frequency circuits of a communication system of the superheterodyne type, said tuner being of the inductance type and having electrically separate tuning sections for the oscillator and mixer, said tuner comprising a metallic base, a shaft rotatively supported in said base, stator and rotor elements carried by said base and shaft respectively, each stator element being flat and being shaped to form an inductance loop and each rotor element being a conducting sheet for changing the inductance of the stator element, said rotor elements being insulatingly mounted upon the shaft, and metallic connecting means between one rotor plate of one section and the adjacent rotor plate of the other section, said connection serving to maintain a substantially constant potential across the mixer tuning section over the tunable range of the device.

3. For use in a superheterodyne type of communication apparatus for operation in the megacycle range and wherein the potential from an oscillator and from a signal source are mixed in one electrode in a mixer, an inductance type tuner comprising a metallic frame, a shaft rotatably carried by said frame, rotor elements insulatingly supported by said shaft and consisting of flat plates movable in their own planes, stator elements consisting of inductance loops supported on said base, said tuner having at least four tuning sections, one section being for the high band part of an oscillator, the second section being for the low band part of the oscillator, the third section being for the high band of a mixer and the fourth section being for the low band of the mixer, each tuning section having individual rotor and stator elements, a metallic connection between one rotor element of the first section and one rotor element of the third section, an oscillating circuit including switching means and said first or second tuning sections so that either the first or second tuning section is in the oscillating circuit depending upon the switch position, a mixer circuit including a connection from said oscillating circuit and also including switching means and said third or fourth tuning sections depending upon the switch position so that said mixer circuit includes either the third or fourth tuning section and means for coupling both said switching means to said shaft so that when the high band is used the first and third tuning sections are connected in the oscillator and mixer circuits respectively and when the low band is used the second and fourth tuning sections are connected in the oscillator and mixer circuits respectively.

4. The tuner, according to claim 3, wherein the rotor elements of the first and third sections are angularly aligned and wherein the rotor elements of the second and fourth sections are displaced 180 degrees from the first and third sections.

5. The tuner, according to claim 3, wherein means for operating the switching means are disposed on the shaft at the end of the frame remote from the first section.

6. The tuner, according to claim 3, wherein the tuner sections follow each other in numerical order, the first and third sections being angularly aligned, the remaining two sections being displaced 180 degrees from the first section and wherein means for operating the switching means are provided on the tuner remote from the first section.

ROBERT R. ENGLISH.

REFERENCES CITED

The following references are of record in the file of this patent:

UNITED STATES PATENTS

| Number | Name | Date |
|---|---|---|
| 2,341,345 | Van Billiard | Feb. 8, 1944 |
| 2,521,963 | Beusman | Sept. 12, 1950 |
| 2,542,416 | Kach et al. | Feb. 20, 1951 |